United States Patent
Kameda

(10) Patent No.: US 7,300,298 B2
(45) Date of Patent: Nov. 27, 2007

(54) BOARD SECURING DEVICE

(75) Inventor: Yasutoshi Kameda, Chiba (JP)

(73) Assignee: FCI, Versailles (FR)

( * ) Notice: Subject to any disclaimer, the term of this patent is extended or adjusted under 35 U.S.C. 154(b) by 0 days.

(21) Appl. No.: 10/540,627

(22) PCT Filed: Dec. 26, 2003

(86) PCT No.: PCT/JP03/16919

§ 371 (c)(1), (2), (4) Date: Mar. 20, 2006

(87) PCT Pub. No.: WO2004/062328

PCT Pub. Date: Jul. 22, 2004

(65) Prior Publication Data

US 2006/0189196 A1    Aug. 24, 2006

(30) Foreign Application Priority Data

Dec. 27, 2002    (JP) .............................. 2002-379001

(51) Int. Cl.
*H01R 13/62* (2006.01)
(52) U.S. Cl. .................................................... 439/326
(58) Field of Classification Search ......... 439/326–328
See application file for complete search history.

(56) References Cited

U.S. PATENT DOCUMENTS

| | | | | |
|---|---|---|---|---|
| 4,678,252 A | * | 7/1987 | Moore | 439/62 |
| 4,903,167 A | | 2/1990 | Lichtensperger | 361/395 |
| 4,938,701 A | | 7/1990 | Heberling | 439/65 |
| 5,224,873 A | * | 7/1993 | Duffet et al. | 439/326 |
| 5,268,820 A | | 12/1993 | Tseng et al. | 361/785 |
| 5,697,802 A | | 12/1997 | Kawabe | 439/326 |
| 5,816,838 A | * | 10/1998 | Del Prete et al. | 439/326 |
| 6,234,820 B1 | * | 5/2001 | Perino et al. | 439/326 |

(Continued)

FOREIGN PATENT DOCUMENTS

DE    34 34 640 A1    4/1986

(Continued)

*Primary Examiner*—Ross Gushi
(74) *Attorney, Agent, or Firm*—Harrington & Smith, PC

(57) ABSTRACT

The present invention provides a board fixing device not having an arm portion along a side edge of a printed circuit board. In a connector having spring contacts forming a contact point row in a direction perpendicular to the insertion direction of a board, when one end of said board is rotated in a direction whereby the spring contacts are pressed while being put into contact with the said spring contacts, during the insertion of the printed circuit board into said connector, and the other end of the opposing printed circuit board is made to approach said board fixing device, a printed circuit board having a corresponding notched portion on its edge portion engages a stabilizing piece formed in a perpendicular direction from one surface of the base portion, and at the same time, engages a protruding portion protruding from said base portion, and is fixed against the driving force of the said spring contacts. Whereby, shaking or swinging in the horizontal direction relative to the motherboard are restricted due to the protruding piece, and shaking and swinging in the vertical direction relative to the motherboard are restricted due to the engaging of the protruding portion of the said base portion and the said other end portion of the printed circuit board.

20 Claims, 10 Drawing Sheets

U.S. PATENT DOCUMENTS

| | | | |
|---|---|---|---|
| 6,270,369 B1* | 8/2001 | Kato et al. | 439/326 |
| 6,428,338 B1 | 8/2002 | Yasufuku et al. | 439/310 |
| 6,527,576 B1* | 3/2003 | Omote | 439/326 |
| 6,663,407 B1* | 12/2003 | Pickles | 439/328 |
| 6,666,702 B1* | 12/2003 | Pickles | 439/328 |
| 6,822,878 B2* | 11/2004 | Dobbs et al. | 361/807 |
| 6,926,549 B2* | 8/2005 | Wang | 439/326 |
| 6,955,554 B2* | 10/2005 | Korsunsky et al. | 439/328 |
| 6,971,899 B1* | 12/2005 | Liu | 439/326 |
| 7,021,953 B2* | 4/2006 | Kawamae | 439/326 |
| 7,074,090 B2* | 7/2006 | Ho et al. | 439/630 |
| 7,077,678 B1* | 7/2006 | Korsunsky et al. | 439/326 |
| 7,114,974 B2* | 10/2006 | Korsunsky et al. | 439/325 |
| 7,134,895 B1* | 11/2006 | Choy et al. | 439/326 |
| 7,134,896 B1* | 11/2006 | Chen | 439/326 |
| 7,182,618 B1* | 2/2007 | Choy et al. | 439/328 |
| 7,220,142 B2* | 5/2007 | Liang | 439/326 |
| 7,241,159 B1* | 7/2007 | Chen | 439/326 |
| 2004/0152353 A1* | 8/2004 | Kawamae | 439/328 |
| 2005/0048828 A1* | 3/2005 | Ho et al. | 439/326 |
| 2005/0112927 A1* | 5/2005 | Wang | 439/326 |
| 2005/0164540 A1* | 7/2005 | Korsunsky et al. | 439/328 |
| 2005/0255734 A1* | 11/2005 | Liu | 439/326 |
| 2006/0094277 A1* | 5/2006 | Yang et al. | 439/328 |
| 2006/0160394 A1* | 7/2006 | Korsunsky et al. | 439/326 |
| 2006/0189196 A1* | 8/2006 | Kameda | 439/326 |
| 2007/0032116 A1* | 2/2007 | Liang | 439/326 |
| 2007/0059964 A1* | 3/2007 | Choy et al. | 439/328 |
| 2007/0105425 A1* | 5/2007 | Wang | 439/326 |

FOREIGN PATENT DOCUMENTS

| | | |
|---|---|---|
| DE | 89 12 800.1 | 4/1991 |
| DE | 90 02 203.3 | 6/1991 |
| DE | 94 03 209.2 | 7/1994 |
| JP | 8-250211 | 9/1996 |
| JP | 11-16646 | 1/1999 |
| JP | 2002-124328 | 4/2002 |

* cited by examiner

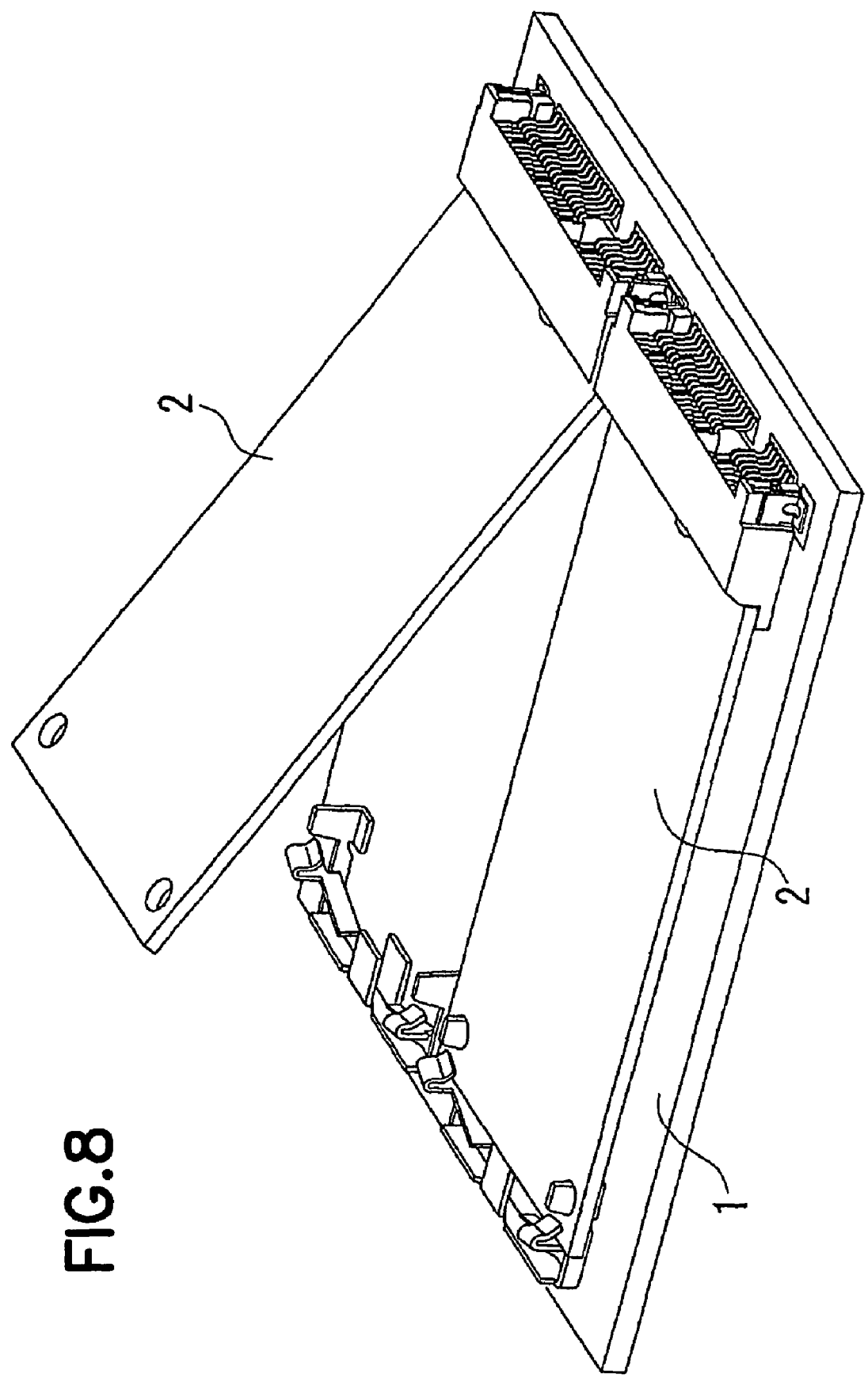

BOARD SECURING DEVICE

TECHNICAL AREA

Concerns a board fixing device for fixing the other end of a printed circuit board, when one end of a printed circuit board for connecting having a contact portion, is inserted into a connector fixed to a motherboard.

BACKGROUND ART

Japanese Unexamined Patent Publication No. H08-185936 provides a socket for a printed circuit board having a housing with an insertion port for receiving a printed circuit board formed between a pair of opposing wall portions; a plurality of spring contacts with their respective contact points protruding from at least one wall portion to the interior of the insertion port, and forming a contact row along the longitudinal direction of the insertion port; a pair of latch arms extending from the portions in the vicinity of each end portion in the longitudinal direction of the insertion port of the abovementioned housing, and moving outwardly by being pressed by the side edge portions of this printed circuit board when the printed circuit board is rotated in the direction in which the printed circuit board presses on each of the abovementioned contact points, and returning to their original positions by their elasticity when the printed circuit board has passed, thereby locking the printed circuit board against the driving force of the abovementioned spring contacts; and a holding portion protruding from the other side of the abovementioned wall portion, preventing the rotation past a predetermined angle of a printed circuit board driven by a spring contact when the latch arms release the locking of the printed circuit board, the abovementioned housing and latch arm being formed out of an integrated member made out of insulating material.

This socket for a connector locks a printed circuit board against the driving force of the said spring contacts using latch guides with a latch mechanism provided on support arms extending along the edge portions of both ends in the insertion direction of a printed circuit board. That is, the fixing means in the vertical direction relative to the motherboard is served by the latch guides, and the fixing means in the horizontal direction relative to the motherboard is served by the said support arms. However, for both of the support arms of the connectors, being formed out of an integrated member made of insulating material, according to this patent publication, the longer they are, the weaker they become against twisting in the said parallel direction.

Therefore, the present Applicant provides a board fixing device being a connector having a plurality of spring contacts forming a contact row along the longitudinal direction of the insertion port, having no support arms along the side edges of the printed circuit board, being a structure fixing the end of the said printed circuit board to be inserted into the said connector, and the other end of said printed circuit board extending towards the insertion direction, and having a shape having sufficient strength against swinging and shaking in the vertical and horizontal directions. A concrete structure shall be explained herebelow.

DISCLOSURE OF THE INVENTION

According to an embodiment of the present invention, the board fixing device according to the present invention is a board fixing device wherein, when a printed circuit board is inserted into a connector fixed to a motherboard wherefrom a printed circuit board is detachable, said connector having spring contacts forming a contact point row in a direction perpendicular to the insertion direction of a board, said printed circuit board is rotated in a direction whereby the said spring contacts are pressed, while one end of said printed circuit board is put into contact with the spring contacts, and the other end of the said printed circuit board is locked against the driving force of said spring contacts, thereby fixing the printed circuit board; comprising a base portion extending along an edge portion of the said other end of the printed circuit board;

protruding portions provided in the vicinity of both ends of the base portion, preventing said printed circuit board from being lifted up when the printed circuit board is fixed, by covering the vicinity of both end portions of an edge portion of the printed circuit board;

and a stabilizing piece being formed in a perpendicular direction from said base portion, and fitting into a notched portion formed in the edge portion of the said other end of the printed circuit board when the printed circuit board is fixed.

In a connector having spring contacts forming a contact row in a direction perpendicular to the board insertion direction, when one end of said board is rotated in the direction whereby the spring contacts are pressed while in contact with the said spring contacts during the insertion of the printed circuit board into said connector, if the said other end of the opposing printed circuit board is fixed to said board fixing device, a notched portion provided on the end edge portion of the said other end of the printed circuit board engages a stabilizing piece formed in a perpendicular direction from one surface of said base portion, and at the same time, the said other end of the printed circuit board locks with protruding portions protruding from said base portion arm, and is fixed against the driving force of the said spring contacts. Thereby, shaking or swinging in the horizontal direction relative to the motherboard is restricted due to the stabilizing piece, and shaking or swinging in the vertical direction relative to the motherboard is restricted due to the engaging of the said protruding portions of the base portion and the said other end portion of the printed circuit board. Therefore, robust fixing against all vertical and horizontal directions can be done.

According to a separate embodiment of the present invention, the board fixing device according to the present invention is board fixing device wherein, when a printed circuit board is inserted into a connector fixed to a motherboard wherefrom a printed circuit board is detachable, said connector having spring contacts forming a contact point row in a direction perpendicular to the insertion direction of a board, said printed circuit board is rotated in a direction whereby the said spring contacts are pressed, while one end of said printed circuit board is put into contact with the spring contacts, and the other end of the said printed circuit board is locked against the driving force of said spring contacts, thereby fixing the printed circuit board; comprising a base portion extending along an edge portion of the said other end of the printed circuit board;

protruding portions provided in the vicinity of both ends of the base portion, preventing said printed circuit board from being lifted up when the printed circuit board is fixed, by covering the vicinity of both end portions of an edge portion of the printed circuit board;

and a stabilizing piece protruding from a mounting piece joined to a base portion whereupon the said printed circuit board is placed, inserted into a hole provided on the printed circuit board when the printed circuit board is fixed, fixing said printed circuit board in the board surface direction.

In a connector having spring contacts forming a contact row in a direction perpendicular to the board insertion direction, when one end of said board is rotated in the direction whereby the spring contacts are pressed while in contact with the said spring contacts during the insertion of the printed circuit board into said connector, if the said other end of the opposing printed circuit board is fixed to said board fixing device, then, for example, by providing a mounting portion whereupon a printed circuit board is put, on the board fixing device according to the present invention, and forming thereon a protruding portion that locks with the board surface, and inserting the said protruding portion formed on the mounting portion into a printed circuit board having an insertion hole and engaging it thereby, then shaking or swinging in a horizontal direction relative to the motherboard is restricted. Additionally, the said other end locks with a protruding portion protruding from a base portion arm, and is fixed against the driving force of the said spring contacts. Thereby, by the engaging of the protruding portion of the said base portion and the said other end portion of the printed circuit board, shaking or swinging in a vertical direction relative to the motherboard is restricted. Therefore, robust fixing against all vertical and horizontal directions can be done.

According to a further separate embodiment of the present invention, the board fixing device according to the present invention is a board fixing device wherein, when a printed circuit board is inserted into a connector fixed to a motherboard wherefrom a printed circuit board is detachable, said connector having spring contacts forming a contact point row in a direction perpendicular to the insertion direction of a board, said printed circuit board is rotated in a direction whereby the said spring contacts are pressed, while one end of said printed circuit board is put into contact with the spring contacts, and the other end of the said printed circuit board is locked against the driving force of said spring contacts, thereby fixing the printed circuit board; comprising
  a base portion extending along an edge portion of the said other end of the printed circuit board;
  protruding portions provided in the vicinity of both ends of the base portion, preventing said printed circuit board from being lifted up when the printed circuit board is fixed, by covering the vicinity of both end portions of an edge portion of the printed circuit board;
  a back portion joined to the said base portion and extending along the back surface of the base portion;
  and a stabilizing piece protruding from the portion joined to the said back portion, that is inserted into a hole provided on a printed circuit board when the said printed circuit board is fixed, thereby fixing said printed circuit board in the board surface direction.

In a connector having spring contacts forming a contact row in a direction perpendicular to the board insertion direction, when one end of said board is rotated in the direction whereby the spring contacts are pressed while in contact with the said spring contacts during the insertion of the printed circuit board into said connector, if the said other end of the opposing printed circuit board is fixed to said board fixing device, then, for example, by forming a back portion along the longitudinal direction of the base portion at a location behind the base portion, and if an engaging piece which engages the board surface of the printed circuit board is formed on an extending member extending from said back portion, the said other end of the printed circuit board locks with the engaging piece formed on the extending member of the said back portion, thereby restricting the shaking or swinging of the printed circuit board in a horizontal direction, and additionally, it locks with a protruding portion protruding from the base portion, and is fixed against the driving force of the said spring contacts. Thereby, shaking or swinging in a vertical direction relative to the motherboard is restricted. Therefore, strong fixing against all vertical and horizontal directions can be done.

According to a further separate embodiment of the present invention, the board fixing device according to the present invention is characterized in that, during the fixing of a printed circuit board, the said back portion restricts the said base portion from being elastically deformed beyond a predetermined amount, when the said base portion is elastically deformed due to contact between the said other end of the printed circuit board and the said inclined surface of the top portion of a protruding portion provided on the base portion.

During the fixing of the printed circuit board, when the edge of the side to be fixed of the printed circuit board presses on the inclined surface of the protruding portion that restricts shaking and swinging in a vertical direction relative to the motherboard, if the said back portion is located so as to restrict excessive elastic deformation of the said base portion, an external force of greater than a certain amount would not be exerted on said base portion, so damage can be prevented.

According to a further separate embodiment of the present invention, the top portion of a protruding portion of the said base portion has an inclined surface inclined towards the motherboard side, and when the said other end is pressed towards the motherboard direction in order to fix a printed circuit board, the said base portion elastically deforms due to a force exerted on the said inclined surface, and when the said other end goes beyond the protruding portion, the said base portion returns to its original position due to resilience, thereby making both end potions of a printed circuit board and the said protruding portions lockable.

Since the top portion of the protruding portion provided on the base portion of the fixing device of the present application has an inclined surface, when a printed circuit board is put into contact with it while rotating it in the direction of said inclined surface, if this pressing is continued, the said base portion, while being elastically deformed, will guide the said other end of the printed circuit board along the said inclined surface. When past the top portion in the protruding direction of the said protruding portion, the said base portion returns to its original position by its resilience, and the said protruding portion locks the edge portion of the printed circuit board driven by the spring contacts. Thereby, fixing is done in a vertical direction relative to the motherboard, and the board is definitely fixed.

According to a further separate embodiment of the present invention, the board fixing device according to the present invention has a grounding terminal portion coming into contact in the vicinity of a side portion of the said other end of a printed circuit board.

For example, if the grounding terminal is made to protrude from one portion of the board fixing device of the present application, and formed by injection or insert molding when a printed circuit board is fixed, the grounding portion of the front end portion of said protruding grounding terminal can be placed so as to come into contact with the vicinity of the side portion of the underside of the edge portion of said printed circuit board, and a grounding connection can be secured by contact with a printed circuit board placed above and off of the motherboard.

According to a further separate embodiment of the present invention, the said grounding terminal is formed integrally from a conducting material, along with the motherboard-fixing portion.

If the said grounding terminal and the fixing portion to the motherboard are formed from a single integral member made from a conducting material, if a connection by soldering or the like between the grounding portion of the motherboard and the fixing portion of the board fixing device of the present application is made, a printed circuit board placed above and off of the motherboard and the said grounding terminal are electrically connected and a grounding portion can be formed.

According to a further separate embodiment of the present invention, the said base portion of the board fixing device according to the present invention is provided with a dividing wall restricting the deformation of the base portion beyond a predetermined amount, when the said base portion elastically deforms due to contact between the said other end of a printed circuit board and the said inclined surface of the top portion of a protruding portion provided on the base portion, during the fixing of a printed circuit board.

For example, by providing a stopper for preventing excessive elastic deformation of the base portion, at a certain distance in the elastic deformation direction of the said base portion, a pressing force of greater than a certain amount would never be exerted from the said printed circuit board, so that breakage of the base portion due to overloading can be prevented.

BRIEF EXPLANATION OF THE DRAWINGS

FIG. 8 is an external view of a dual socket fixing-type motherboard 1 whereon a printed circuit board fixing device according to a further and separate embodiment of the present invention.

EXPLANATION OF THE REFERENCE NUMBERS

Figure 1:
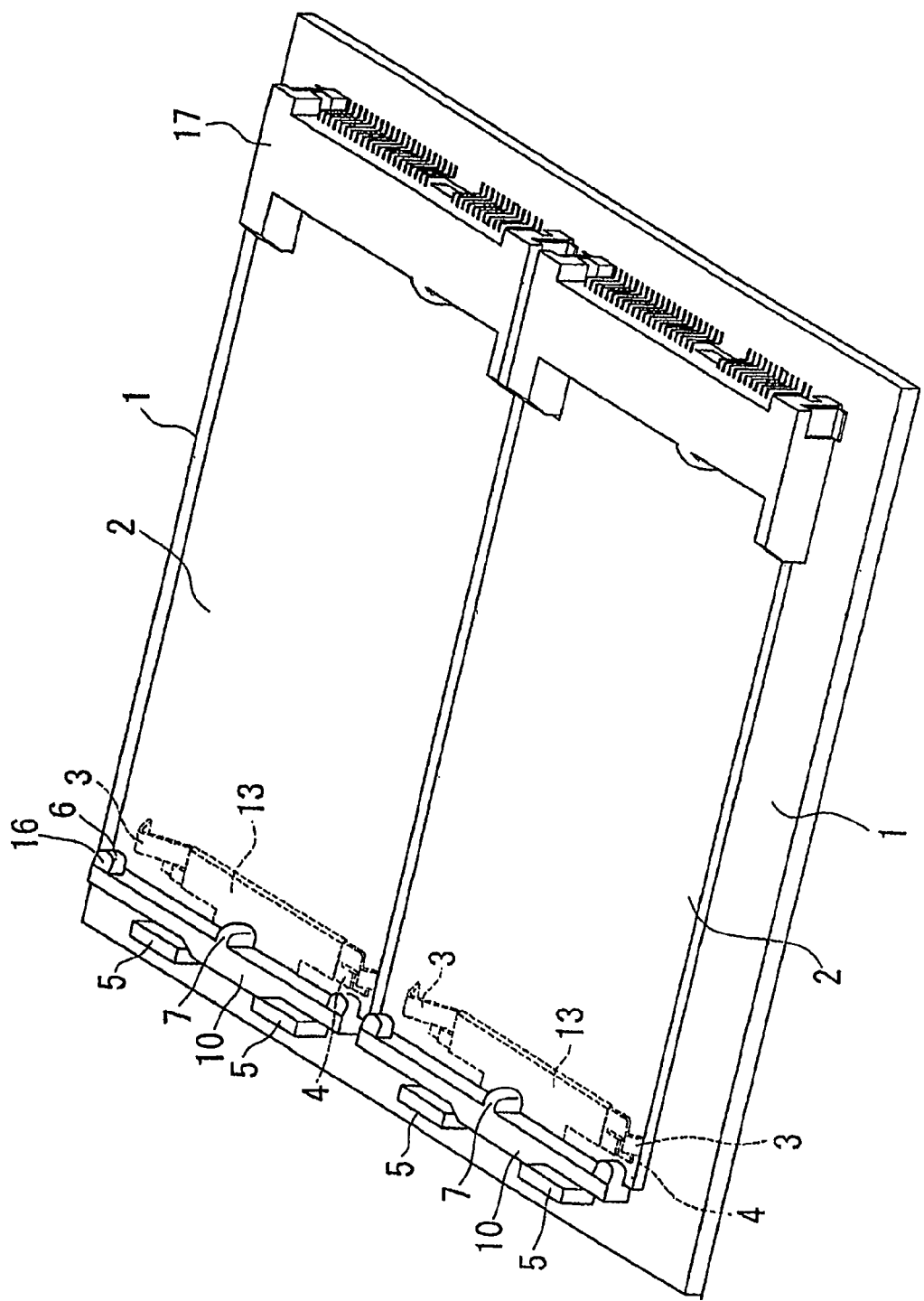
FIG. 1 is an external view of a dual socket fixing-type motherboard 1 whereon a printed circuit board fixing device is placed.

1 . . . motherboard
2 . . . printed circuit board
3 . . . grounding terminal
4 . . . motherboard-fixing portion
5 . . . wall
6 . . . protruding portion
7 . . . stabilizing piece
8 . . . grounding pad
10,20,30 . . . base portion
12 . . . supporting portion
14 . . . notched portion
15 . . . inclined portion
16,26,36 . . . inclined surface
17 . . . connector
19 . . . extending portion
21 . . . snap-type peg
23 . . . mounting
24 . . . supporting portion
25 . . . stabilizing piece
28 . . . locking piece
29 . . . protruding portion
31 . . . supporting surface
32 . . . protruding piece
33 . . . joining portion
35 . . . raised portion
39 . . . protruding portion
40 . . . back portion
41 . . . extending portion
42 . . . locking piece
43 . . . base end piece
44 . . . supporting portion
45 . . . bent back portion
48 . . . balancing piece

BEST MODES FOR EMBODYING THE INVENTION

EMBODIMENT 1

FIG. 1 is an external view of when a printed circuit board 2 is completely fixed to a dual socket fixed-type motherboard 1 whereon the fixing device of the present application is placed, by rotating one end of said printed circuit board 2, in a connector 17 having spring contacts forming a contact row in a direction perpendicular to the board insertion direction, during the insertion of the printed circuit board 2 into said connector 17, while making contact with the said spring contacts, in a direction whereby the spring contacts are pressed.

Figure 2:
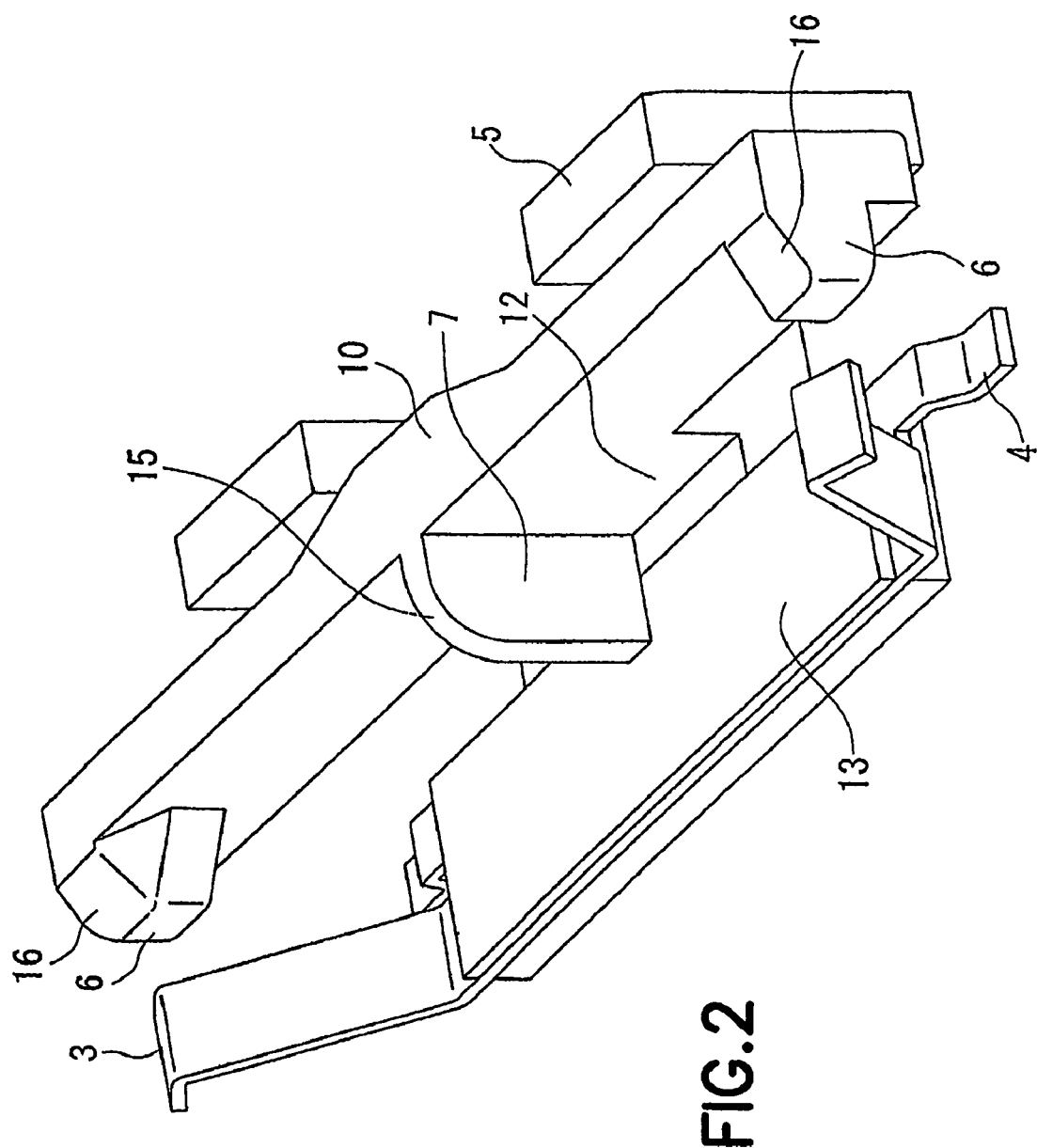
FIG. 2 is a perspective view of an exemplary embodiment of the printed circuit board fixing device according to the present invention.

FIG. 2 shows a perspective view of an exemplary embodiment of the printed circuit board fixing device according to the present invention. Said board fixing device is fixed by fixing portions 4 to a motherboard 1 (see FIG. 1). A base portion 10 extends along the edge to be fixed of a printed circuit board 2, and on both end portions of said base portion 10, when the printed circuit board 2 is fixed, protruding portions 6 covering portions of the said edge protrude from one surface of the said base portion 10.

When the printed circuit board 2 is fixed, a surface 16 of the said protruding portions 6 opposing the rotation direction of the printed circuit board 2, is inclined in the direction of the motherboard. The said base portion 10 is integrally formed via a supporting portion 12, with an elastic insulating member and a mounting piece 13 located between the motherboard 1 and said printed circuit board 2. A stabilizing piece 7 is provided that protrudes perpendicularly from both a surface of the said mounting piece 13 and the surface of the said base portion 10 having the said protruding portion 6, and its top portion 15 is curved and inclined.

If the printed circuit board 2 is pressed along the inclined surfaces 16 of the said protruding portions 6 of the said base portion 10 while it is rotating in the direction of said board fixing device, and at the same time, a notched portion 14 (see FIG. 3) provided on an edge of the said printed circuit board is engaged along the inclined portion 15 of the top portion of said stabilizing piece 7, the edge of said printed circuit board 2 will go past the said protruding portions 6 due to elastic deformation of the said base portion 10. When the said rotation is finished, the said printed circuit board 2 has been placed and fixed on a surface opposing the mounting piece 13, and is maintained in a state roughly parallel to the motherboard 1.

Here, when the printed circuit board 2 goes past the said protruding portions 6 and is fixed in a predetermined position, the elastic deformation of the said base portion 10 recovers and returns to its original position, and the said protruding portions 6 are locked against the force of the spring contacts which are perpendicular to the motherboard 1, covering a portion of the edge of the printed circuit board 2. That is, it is robustly fixed in a vertical direction relative to motherboard 1. Additionally, since the said stabilizing piece 7 engages perpendicularly with the printed circuit board 2 having the said notched portion 14, the printed circuit board 2 cannot shake or swing in a horizontal direction relative to said board surface. That is, it is robustly fixed in a horizontal direction relative to the motherboard 1. Therefore, the printed circuit board 2 is robustly fixed in all horizontal and vertical directions.

Grounding terminals 3 and fixing portions 4 to the motherboard, which extend from both sides of the said mounting piece 13 in the longitudinal direction thereof, are integrally shaped by punching metal or the like, and formed integrally with the said mounting piece 13 by injection or insertion molding. Said grounding terminals 3 extend diagonally upwards towards grounding portions provided in the vicinity of the ends of the printed circuit board 2, and are electrically connected by coming into contact with pads 8 (see FIG. 3) that are the grounding portions of the front surface and the reverse surface of the said printed circuit board 2. The fixing portions 4 to said motherboard 1 extend diagonally downwards towards the motherboard, and are electrically connected with grounding portions of the motherboard by soldering or the like. Additionally, on the back surface of the base portion 10, a wall 5 corresponding to a stopper in order to restrict the excessive elastic deformation of the base portion 10 is formed in a direction perpendicular to an extending portion 19 (see FIG. 4) from the said mounting piece 13, and one surface of the said wall is almost parallel to, and maintains a constant distance with, the back surface of the said base portion 10.

Figure 3:
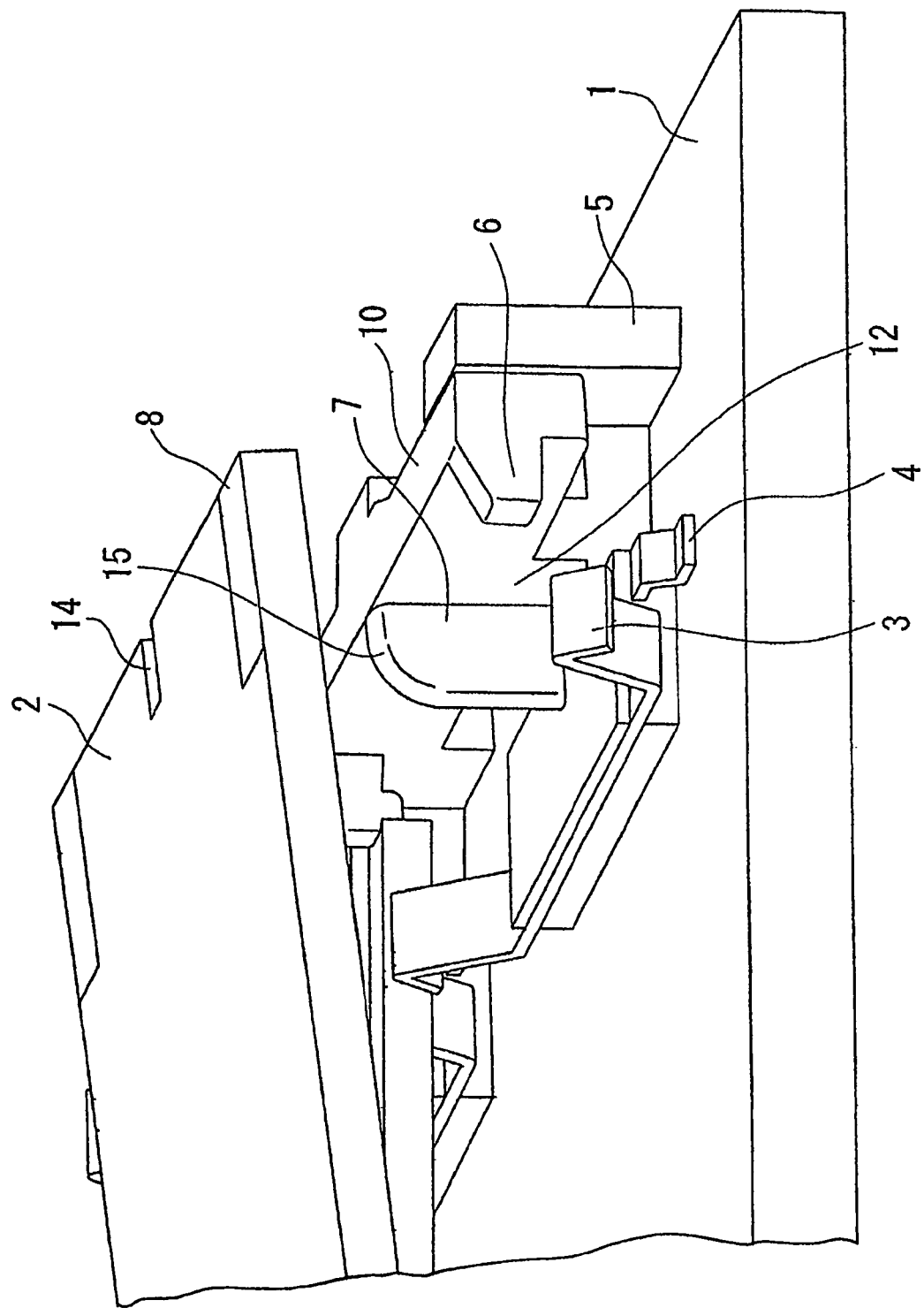
FIG. 3 shows an external view of a rotating printed circuit board approaching the fixing device in the present embodiment.

FIG. 3 shows an external view of a rotating printed circuit board approaching a fixing device in the present embodiment. The positional relationships of each of the engaging portions when the rotation is completed shall be explained. The said stabilizing piece 7 meets with the said notched portion 14, the said protruding portions 6 come into contact with the edge of the printed circuit board 2, and the said grounding terminals 3 come into contact with the undersurface side grounding pad 8 of the printed circuit board 2.

Figure 4:
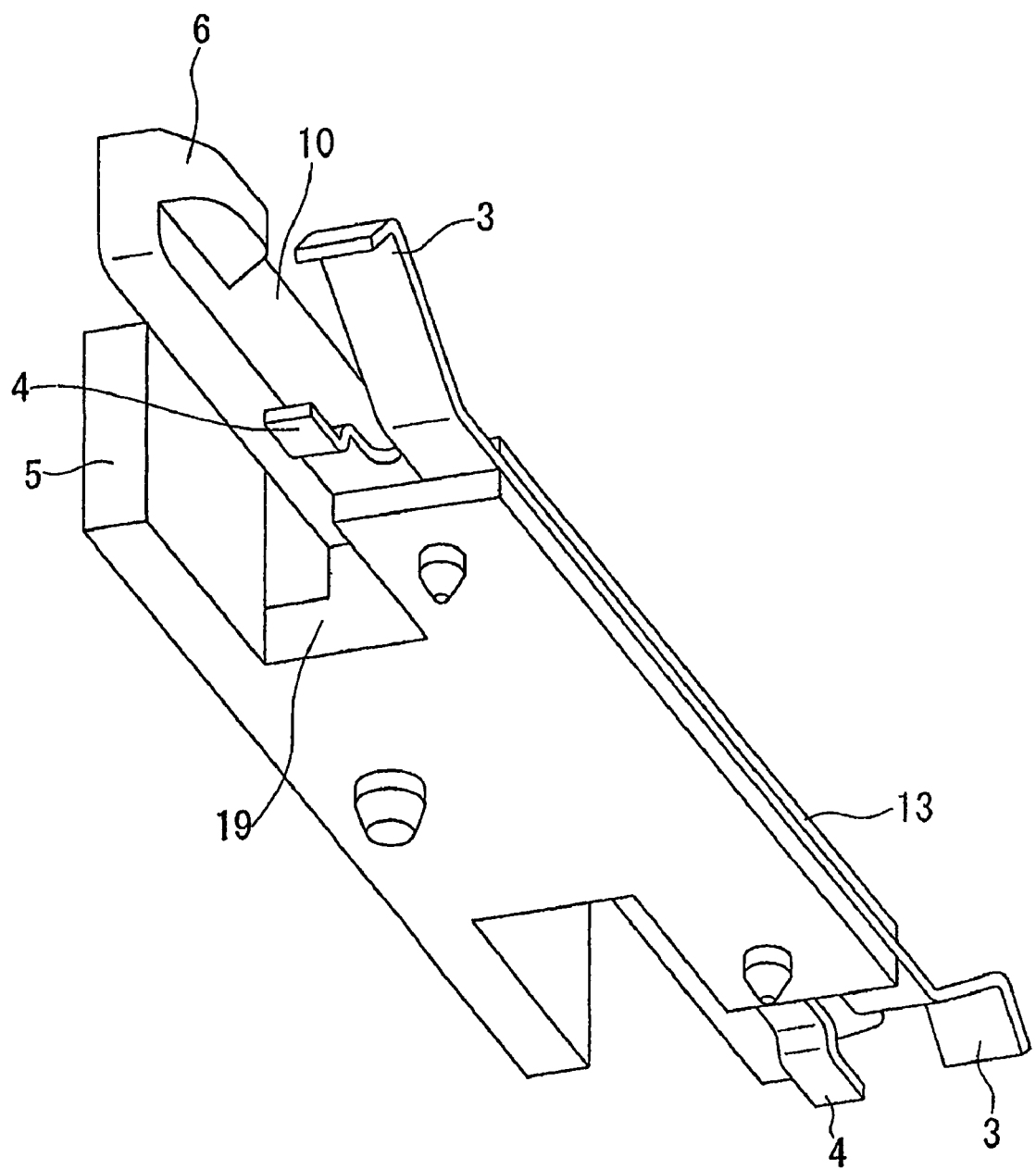
FIG. 4 is a perspective view from a different viewpoint of an exemplary embodiment of the printed circuit board fixing device according to the present invention of FIG. 1.

FIG. 4 is a perspective view from a different perspective of an exemplary embodiment of the printed circuit board fixing device according to the present invention in FIG. 2.

EMBODIMENT 2

Figure 5A:
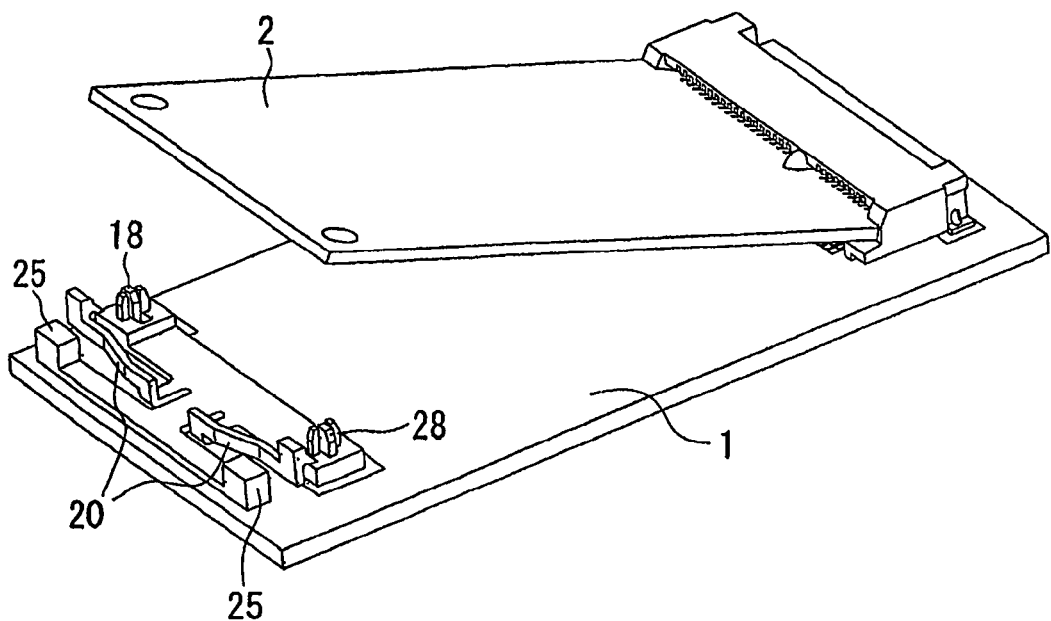
FIGS. 5(a) and (b) are external views of single socket fixing-type motherboards 1 whereon are placed other embodiments of the printed circuit board fixing device according to the present invention.
Figure 5B:
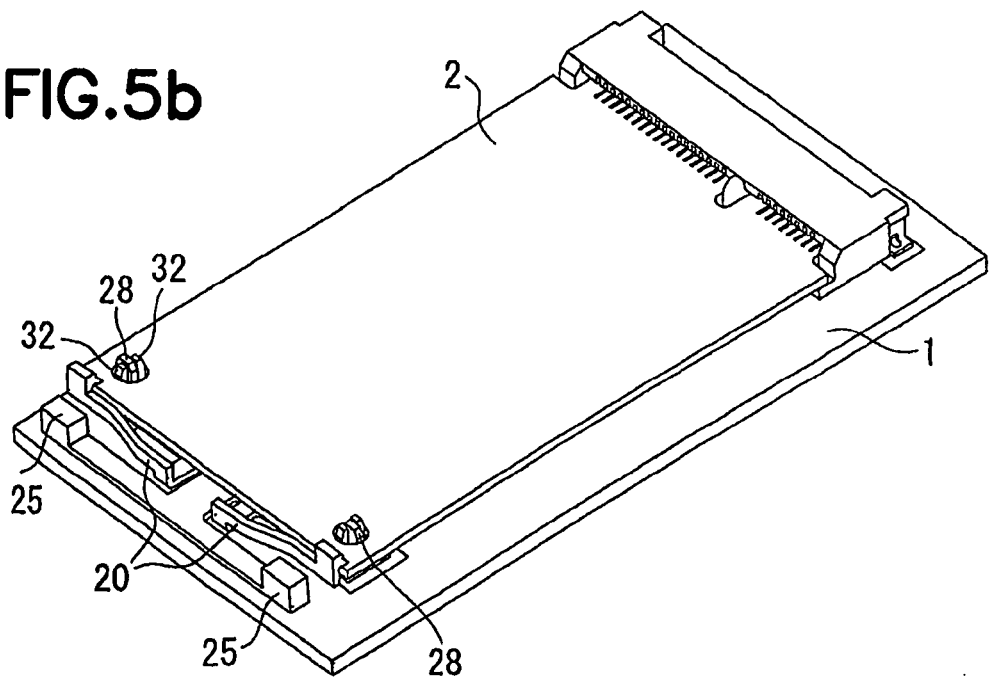

FIGS. 5(*a*) and (*b*), similarly to FIG. 1, are external views showing the procedure of completely fixing a printed circuit board 2 to a single socket fixed motherboard 1 whereon a printed circuit board fixing device according to a separate embodiment of the present invention has been placed. In FIG. 5, said printed circuit board fixing device is integrally formed by molding in the form of the present embodiment, but this may be integrally formed by a metal member, and it is fixed by inserting a snap-type peg 21 (see FIG. 6) in the motherboard 1.

Figure 6:
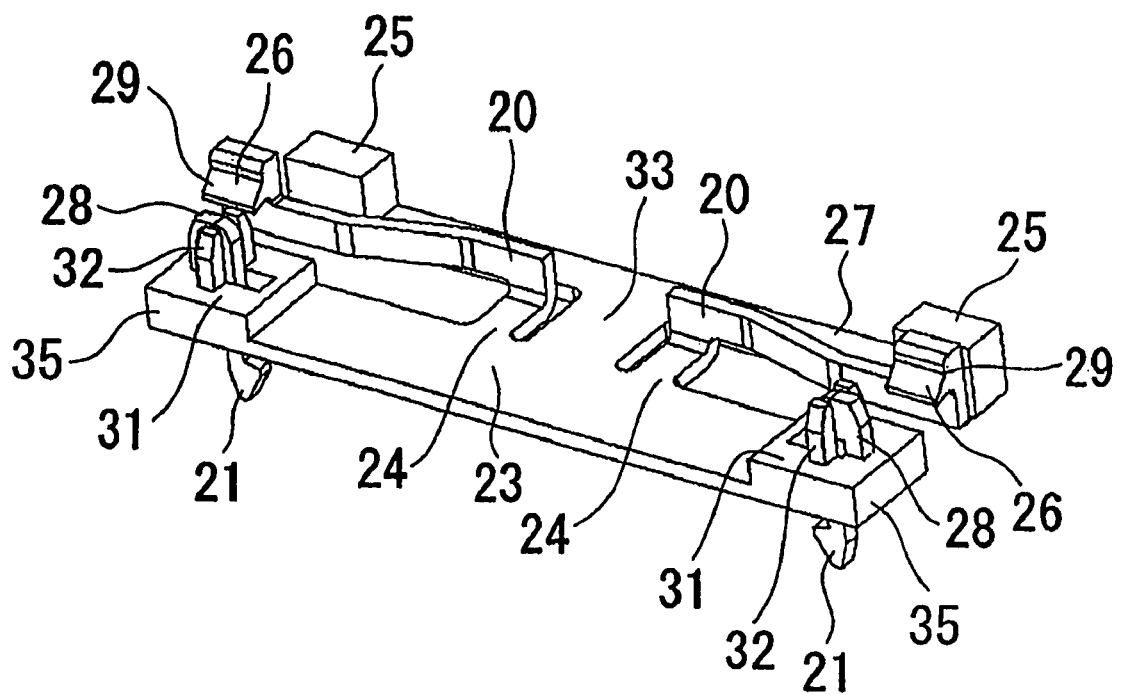
FIG. 6 shows a perspective view of a printed circuit board fixing device shown in FIG. 5.
Figure 7A:
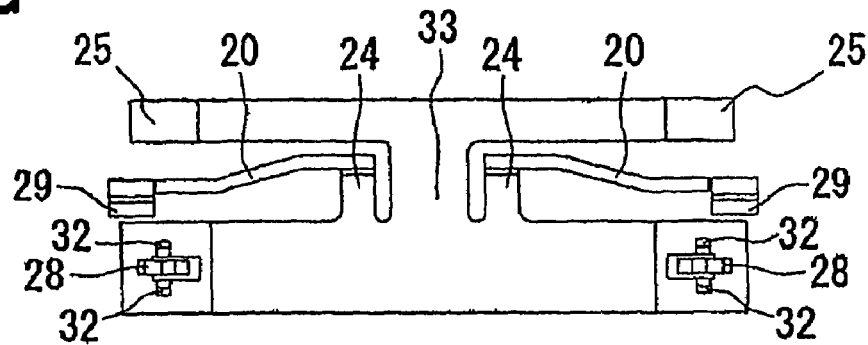
FIGS. 7(a) through (e) are a top view, front view, bottom view, side view, and back view of the printed circuit board fixing device according to the present invention of FIG. 6.
Figure 7B:
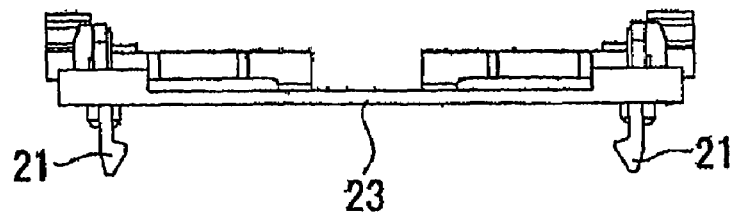
Figure 7C:
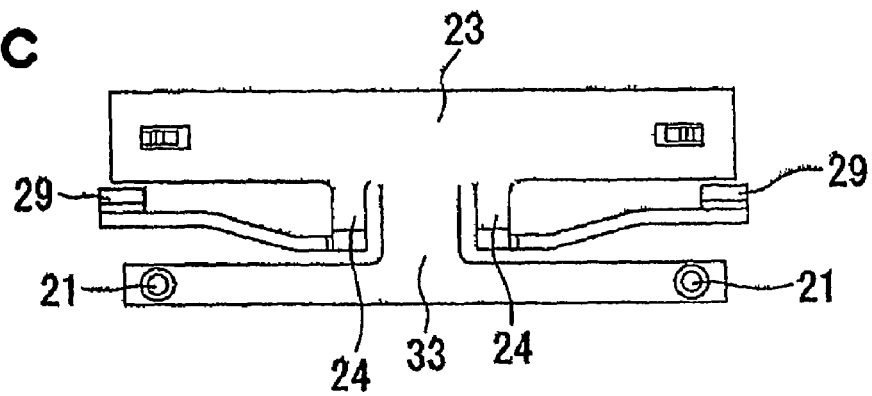
Figure 7D:
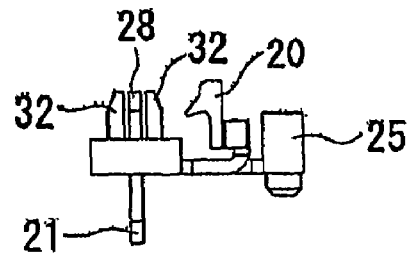
Figure 7E:
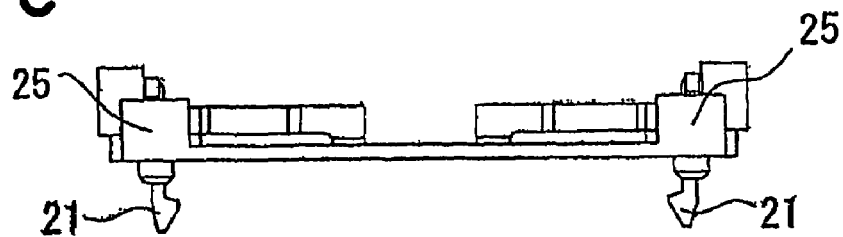

FIG. 6 shows a perspective view of the printed circuit board fixing device shown in FIG. 5. Base portions 20 joined to a mounting piece 23 extend via two supporting portions 24 along the edge of the printed circuit board 2 on the side to be fixed, and are inclined to some degree in the direction of the edge of the printed circuit board 2 in such a way that the edge of the printed circuit board 2 comes into contact with them in the vicinity of both ends, when the printed circuit board is fixed. On both end portions of said base portion 20, a protruding portion 29 protrudes from one portion of the said base portion 20 in such a way that when the printed circuit board 2 is fixed, it covers a portion of the said edge.

The surface 26 of the said protruding portion 29 against the rotation direction for fixing the printed circuit board 2 is inclined in the direction of the motherboard 1. On both ends in the direction of the printed circuit board 2 on the side to be fixed, raised portions 35 are formed in a direction perpendicular to a surface of the said mounting piece 23, and supporting surfaces 31 for the printed circuit board 2 are formed. Said supporting surfaces 31 have holes penetrating through in the direction of the motherboard 1, and the said snap-type pegs 21 integrally formed with locking pieces 28 are inserted through the said holes, whereby the said supporting surfaces 31 and the said locking pieces 28 are engaged and fixed. Two protruding pieces 32 protruding in a perpendicular direction from the said supporting surfaces 31 extend on both sides of each locking piece 28 in the longitudinal direction connecting the locking pieces 28 on either side, and the said locking pieces 28 and the said two protruding pieces 32 intersect and form a cross-shaped protruding portion, which functions as a fixing means for fixing the printed circuit board 2.

In the process of fixing the printed circuit board 2 to the said motherboard 1, if while the printed circuit board rotates in the direction of said board fixing device, the said cross-shaped protruding portion is inserted through the penetration holes provided in the vicinity of the edge portions of both ends of the said printed circuit board, and at the same time, it comes into contact with the inclined surfaces 26 of the protruding portions 29 of the said base portions 20 and is pressed along them, the edge of the printed circuit board 2 goes past the said protruding portion 29 due to the elastic deformation of the said base portion 20. When the said rotation is finished, the printed circuit board 2 is positioned on top of the said supporting surface 31, that is, it is held and maintained with an intervening space between it and the motherboard 1 formed by the said raised portion 35.

Here, if a printed circuit board 2 is positioned past the said protruding portion 29 to a predetermined position, the elastic deformation of the said base portion 20 recovers and it returns to its original position, and due to the said protruding portion 29 covering a portion of the edge of the printed circuit board 2, locking with said board surface in a vertical direction is realized. Therefore, the printed circuit board is robustly fixed in all horizontal and vertical directions.

Additionally, from the said mounting piece 23, a support platform 27 extends in the longitudinal direction of the said base portion 20, via a joining portion 33 extending between the said two supporting portions 24, and on both ends of said support platform 27, stabilizing pieces 25 are formed. Each of the surfaces of the said mounting piece 23, the said joining portion 33, and the said support platform are on the same plane. Said stabilizing piece 25 has the role of a stopper to restrict the excessive elastic deformation of the base portion 20 during fixing of the said printed circuit board 2. Additionally, one surface of the said stabilizing piece 25 maintains a constant distance with, and is almost parallel to, the back surface of the said base portion 20.

FIG. 7(*a*) through (*e*) respectively show a top view, front view, bottom view, side view, and back view of the board fixing device shown in FIG. 6.

EMBODIMENT 3

FIG. 8, as explained in FIG. 1, is an external view showing, for a dual socket fixed-type motherboard 1 whereon a printed circuit board fixing device of a further separate embodiment according to the present invention is placed, on the one hand, the state immediately prior to the fixing operation of a printed circuit board 2, and on the other hand, the state where a printed circuit board 2 is already fixed.

Figure 9:
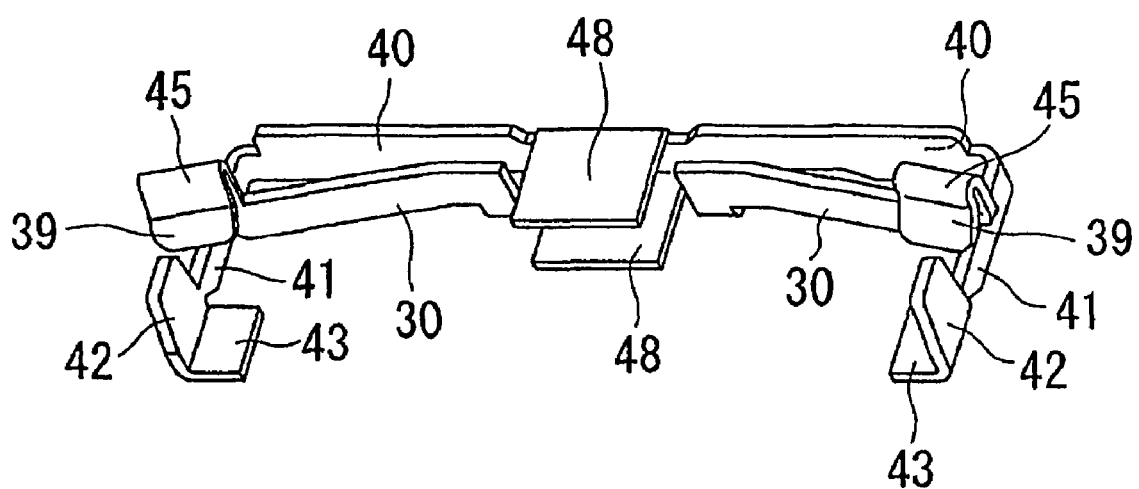
FIG. 9 shows a perspective view of the printed circuit board fixing device shown in FIG. 8.
Figure 10A:
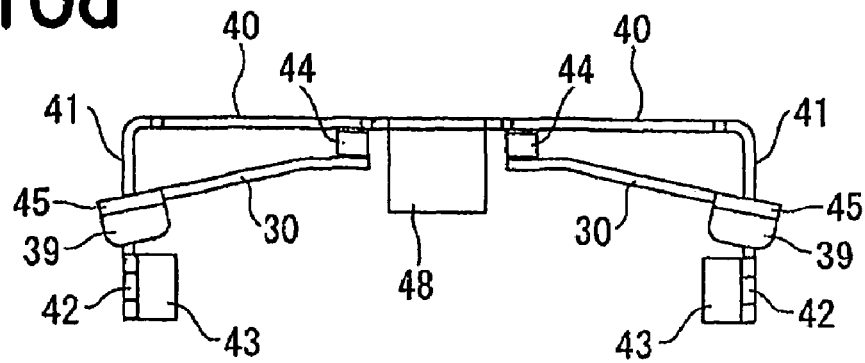
FIG. 10(a) through (d) respectively show a top view, a front view, a bottom view, and a side view of the printed circuit fixing device according to FIG. 9.
Figure 10B:
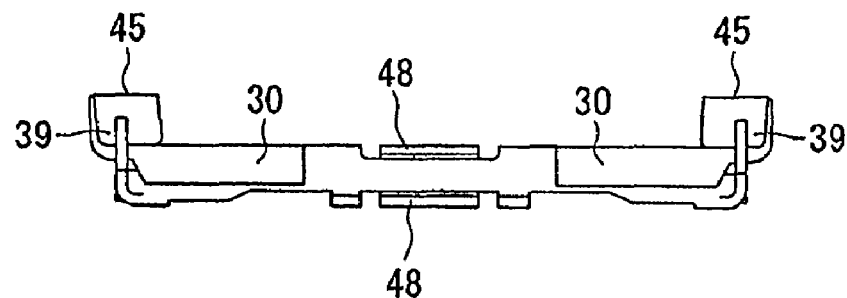
Figure 10C:
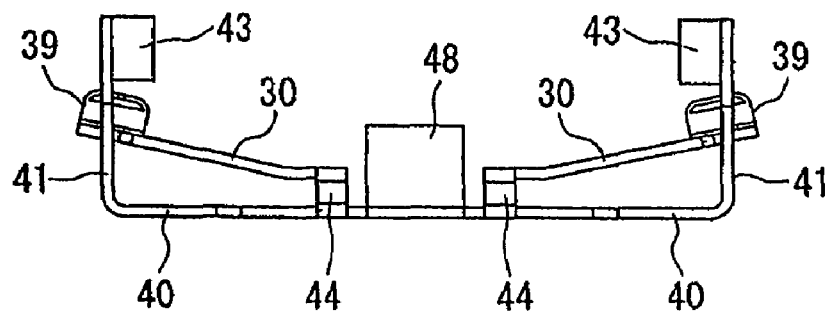
Figure 10D:
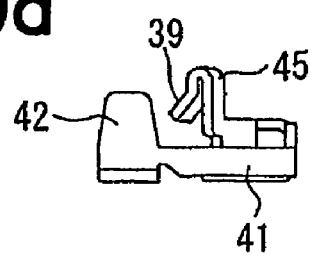

FIG. 9 shows a perspective view of the printed circuit board fixing device shown in FIG. 8. Said circuit fixing device is formed from metallic material, and is shaped integrally by punching or the like. In said board fixing device, via two supporting portions 44 (see FIG. 10(*a*)) extending in a perpendicular direction from a back portion 40 extending in the direction of the edge of the side to be fixed of a printed circuit board 2, a surface of said back portion 40 and a surface of two base portions 30 extending along an extending direction are positioned opposite to each other with a space in between. Said base portions 30 extend while inclining in such a way that the space to the surface of the said back surface 40 becomes wider from the said supporting portions 44 to the free ends. On both end portions of said base portions 30, bent back portions 45 (see FIG. 10(*d*)) extend vertically upwards relative to said base portion 30, and when a printed circuit board 2 is fixed, at the free ends of the said bent back portions 45, protruding portions 39 are formed which are formed so as to cover a portion of the edge of the said printed circuit board 2. From both ends of the said back portion 40, an extending portion 41 extends in a perpendicular direction so as to form an L-shape. On the front ends of each of said extending portions 41, engaging pieces 42 formed so as to form right angles to a surface of a printed circuit board 2 when said printed circuit board is rotated and fixed are positioned to be mutually parallel, and base end pieces 43 extend in opposing directions so as to form L-shapes or backwards L-shapes in a perpendicular direction from each of said engaging pieces 42. Finally, two balancing pieces 48 extend in a parallel manner while maintaining a constant space in between, in the direction in which the said extending portion 41 extends, between the two supporting portions 44 that form base ends of the said base portions 30.

In the process of fixing a printed circuit board 2 to the said motherboard 1, if while the printed circuit board 2 is rotated in the direction of said board fixing device, the said engaging pieces 42 are inserted through penetration holes provided in the vicinity of the edge of both ends of the said printed circuit board 2, and at the same time, an edge on the side to be fixed of the printed circuit board 2 comes into contact with and is pressed along the surfaces 36 of the protruding portions 39 of the bent back portions 45 of the said base portions 30, that incline towards the motherboard, it goes past the said protruding portion 39 by the elastic deformation of the said base portion 30. When the said rotation is finished, the said printed circuit board 2 is positioned on a surface opposing the extending portion 41, and is kept parallel to said motherboard with a space in the perpendicular direction relative to the motherboard of said extending portion 41. In the process of fixing the printed circuit board, since the base portion 30 is inclined in such a way that the space to the said back portion 40 widens, as mentioned above, so that the printed circuit board 2 does not come into contact with the balancing piece 48.

Here, when the printed circuit board 2 is positioned in a predetermined position past the said protruding portion 39, the elastic deformation of the said base portion 30 recovers, and it returns to its original position, and by covering portions of the edge of the printed circuit board 2, the said protruding portion 39 locks it. Additionally, in order for the said locking pieces 42 to be inserted through the penetration holes of the said printed circuit board 2, they engage the board surface of the printed circuit board 2 at right angles, thereby locking the printed circuit board 2 in the horizontal direction relative to said board surface. Therefore, the printed circuit board 2 is robustly fixed in all the horizontal and vertical directions.

Additionally, the said back portion 40 has the role of a stopper that restricts the excessive elastic deformation of the said base portions 30 during fixing of the printed circuit board 2, with its surface that opposes the back surface of the said base portion 30 with a space in between.

FIG. 10(*a*) through (*d*) respectively show a top view, front view, bottom view, and side view of a printed circuit board fixing device according to the present invention of FIG. 9.

Regarding each of the embodiments, the same constituent features have the same reference numbers.

Effects

By procedures such as those explained above, a board fixing device can be provided that can robustly fix a printed circuit board in all the horizontal and vertical directions. Since there is no need, as in the conventional art, for arm portions that extend from both ends in the longitudinal direction of connectors that have contact terminals and protect the side edge portions of a printed circuit board, there is the advantage that the size of the printed circuit board may be changed freely.

INDUSTRIAL APPLICABILITY

The present invention is applicable as a fixing device for a printed circuit board that is mounted on a motherboard.

The invention claimed is:

1. A board fixing device wherein, when a printed circuit board is inserted into a connector fixed to a motherboard wherefrom a printed circuit board is detachable, said connector having spring contacts forming a contact point row in a direction perpendicular to the insertion direction of a board, said printed circuit board is rotated in a direction whereby the said spring contacts are pressed, while one end of said printed circuit board is put into contact with the spring contacts, and the other end of the said printed circuit board is locked against the driving force of said spring contacts, thereby fixing the printed circuit board; comprising
   a base portion extending along an edge portion of the said other end of the printed circuit board;
   protruding portions provided in the vicinity of both ends of the base portion, preventing said printed circuit board from being lifted up when the printed circuit board is fixed, by covering the vicinity of both end portions of an edge portion of the printed circuit board;
   and a stabilizing piece being formed in a perpendicular direction from said base portion, and fitting into a notched portion formed in the edge portion of the said other end of the printed circuit board when the printed circuit board is fixed.

2. A board fixing device recited in claim 1, having a grounding terminal portion coming into contact in the vicinity of a side portion of the said other end of a printed circuit board.

3. A board fixing device recited in claim 2, wherein the said grounding terminal is formed integrally from a conducting material, along with the motherboard-fixing portion.

4. A board fixing device recited in claim 1, characterized in that the top portion of a protruding portion of the said base portion has an inclined surface inclined towards the motherboard side, and when the said other end is pressed towards the motherboard direction in order to fix a printed circuit board, the said base portion elastically deforms due to a force exerted on the said inclined surface, and when the said other end goes beyond the protruding portion, the said base portion returns to its original position due to resilience, thereby making both end portions of a printed circuit board and the said protruding portions lockable.

5. A board fixing device recited in claim 4, comprising a wall that restricts the deformation of a base portion beyond a predetermined amount, when the said base portion elastically deforms due to contact between the said other end of a printed circuit board and the said inclined surface of the top portion of a protruding portion provided on the base portion, during the fixing of a printed circuit board.

6. A board fixing device wherein, when a printed circuit board is inserted into a connector fixed to a motherboard wherefrom a printed circuit board is detachable, said connector having spring contacts forming a contact point row in a direction perpendicular to the insertion direction of a board, said printed circuit board is rotated in a direction whereby the said spring contacts are pressed, while one end of said printed circuit board is put into contact with the spring contacts, and the other end of the said printed circuit board is locked against the driving force of said spring contacts, thereby fixing the printed circuit board; comprising
   a base portion extending along an edge portion of the said other end of the printed circuit board;
   protruding portions provided in the vicinity of both ends of the base portion, preventing said printed circuit board from being lifted up when the printed circuit board is fixed, by covering the vicinity of both end portions of an edge portion of the printed circuit board;
   and a stabilizing piece protruding from a mounting piece joined to a base portion whereupon the said printed circuit board is placed, that is inserted into a hole provided on the printed circuit board when the printed circuit board is fixed, thereby fixing said printed circuit board in the board surface direction.

7. A board fixing device recited in claim 6, characterized in that the top portion of a protruding portion of the said base portion has an inclined surface inclined towards the motherboard side, and when the said other end is pressed towards the motherboard direction in order to fix a printed circuit board, the said base portion elastically deforms due to a force exerted on the said inclined surface, and when the said other end goes beyond the protruding portion, the said base portion returns to its original position due to resilience, thereby making both end potions of a printed circuit board and the said protruding portions lockable.

8. A board fixing device wherein, when a printed circuit board is inserted into a connector fixed to a motherboard wherefrom a printed circuit board is detachable, said connector having spring contacts forming a contact point row in a direction perpendicular to the insertion direction of a board, said printed circuit board is rotated in a direction whereby the said spring contacts are pressed, while one end of said printed circuit board is put into contact with the spring contacts, and the other end of the said printed circuit board is locked against the driving force of said spring contacts, thereby fixing the printed circuit board; comprising
   a base portion extending along an edge portion of the said other end of the printed circuit board;
   protruding portions provided in the vicinity of both ends of the base portion, preventing said printed circuit board from being lifted up when the printed circuit board is fixed, by covering the vicinity of both end portions of an edge portion of the printed circuit board;
   a back portion joined to the said base portion and extending along the back surface of the base portion;
   and a stabilizing piece protruding from the portion joined to the said back portion, that is inserted into a hole provided on a printed circuit board when the said printed circuit board is fixed, thereby fixing said printed circuit board in the board surface direction.

9. A board fixing device recited in claim 8, characterized in that the top portion of a protruding portion of the said base portion has an inclined surface inclined towards the motherboard side, and when the said other end is pressed towards the motherboard direction in order to fix a printed circuit board, the said base portion elastically deforms due to a force exerted on the said inclined surface, and when the said other end goes beyond the protruding portion, the said base portion returns to its original position due to resilience, thereby making both end portions of a printed circuit board and the said protruding portions lockable.

10. A board fixing device recited in claim 9, characterized in that during the fixing of a printed circuit board, the said back portion restricts the said base portion from being elastically deformed beyond a predetermined amount, when the said base portion is elastically deformed due to contact between the said other end of the printed circuit board and the inclined surface of the top portion of a protruding portion provided on the base portion.

11. A board fixing device configured to cooperate with a connector fixed to a motherboard and configured to detachably receive a printed circuit board, the connector having spring contacts forming a contact point row in a direction perpendicular to an insertion direction of the printed circuit board, wherein the printed circuit board is rotated in a direction whereby the spring contacts are pressed, while one end of the printed circuit board is put into contact with the spring contacts, and an opposite end of the printed circuit board is locked against the driving force of the spring contacts, thereby fixing the printed circuit board; comprising:

a base portion configured to extend along an edge portion of the opposite end of the printed circuit board;

printed circuit board when the printed circuit board is fixed, thereby fixing the printed circuit board in the direction perpendicular to the direction of insertion.

12. A board fixing device recited in claim 11, wherein the fixing system comprises a stabilizing piece protruding from a mounting piece joined to the base portion upon which the printed circuit board is placed, wherein the stabilizing piece is configured to be inserted into a hole provided on the printed circuit board when the printed circuit board is fixed, thereby fixing the printed circuit board in the direction perpendicular to the direction of insertion.

13. A board fixing device recited in claim 11, wherein the fixing system comprises a fixing means for fixing the printed circuit board in the direction perpendicular to the direction of insertion, parallel to the motherboard.

14. A board fixing device recited in claim 11, comprising a back portion joined to the base portion and extending along a back surface of the base portion and wherein the fixing system comprises a stabilizing piece protruding from a portion joined to the back portion adapted to be inserted into a hole provided on the printed circuit board when the printed circuit board is fixed, thereby fixing the printed circuit board in the direction perpendicular to the direction of insertion.

15. A board fixing device recited in claim 14, wherein during the fixing of a printed circuit board, the back portion is configured to restrict the base portion from being elastically deformed beyond a predetermined amount, when the base portion is elastically deformed due to contact between the opposite end of the printed circuit board and an inclined surface of a top portion of the protruding portion provided on the base portion.

16. A board fixing device recited in claim 11, wherein the fixing system comprises a stabilizing piece being formed in a perpendicular direction from the base portion, and adapted to be fitted into a notched portion formed in the edge portion of the opposite end of the printed circuit board when the printed circuit board is fixed.

17. A board fixing device recited in claim 16, comprising a wall that restricts deformation of the base portion beyond a predetermined amount, when the base portion elastically deforms due to contact between the opposite end of a printed circuit board and an inclined surface of a top portion of the protruding portion provided on the base portion, during the fixing of a printed circuit board.

18. A board fixing device recited in claim 16, wherein a top portion of the protruding portion of the base portion has an inclined surface inclined towards a motherboard side, and when the opposite end is pressed towards the motherboard in order to fix the printed circuit board, the base portion elastically deforms due to a force exerted on the inclined surface, and when the opposite end goes beyond the protruding portion, the base portion returns to its original position due to resilience, thereby making both end potions of the printed circuit board and the protruding portions lockable.

19. A board fixing device recited in claim 16, having a grounding terminal portion coming into contact in a vicinity of a side portion of the opposite end of the printed circuit board.

20. A board fixing device recited in claim 16, wherein the grounding terminal is formed integrally from a conducting material, along with a motherboard-fixing portion.

* * * * *

UNITED STATES PATENT AND TRADEMARK OFFICE
CERTIFICATE OF CORRECTION

PATENT NO. : 7,300,298 B2
APPLICATION NO. : 10/540627
DATED : November 27, 2007
INVENTOR(S) : Kameda It is certified that error appears in the above-identified patent and that said Letters Patent is hereby corrected as shown below:

In Claim 7, Column 12, line 2, after "that" delete "the" and replace with --a--; same line delete "said"; line 6, delete "said"; line 7, delete both occurrences of the word "said"; line 8 delete "said"; line 10 delete "potions" and insert --portions--; line 11 delete "said".

In Claim 11, Column 13, delete line 3 through line 5 and replace with --protruding portions provided in a vicinity of two ends of the base portion, preventing the printed circuit board from being lifted up when the printed circuit board is fixed, by covering a vicinity of end portions of the edge portion of the printed circuit board;

wherein the board fixing device further comprises a fixing system configured to substantially stationarily fix the printed circuit board to prevent movement of the printed circuit board in a direction perpendicular to the direction of insertion, parallel to the motherboard.

In Claim 20, Column 14, line 29, delete "16", and replace with --19--.

Signed and Sealed this

Twenty-seventh Day of May, 2008

JON W. DUDAS
*Director of the United States Patent and Trademark Office*